United States Patent
Yamanaka

(12) 
(10) Patent No.: US 8,088,539 B2
(45) Date of Patent: Jan. 3, 2012

(54) EXPOSURE ALIGNING METHOD AND EXPOSURE APPARATUS

(75) Inventor: Eiichirou Yamanaka, Kumamoto (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 249 days.

(21) Appl. No.: 12/453,603

(22) Filed: May 15, 2009

(65) Prior Publication Data

US 2009/0291374 A1    Nov. 26, 2009

(30) Foreign Application Priority Data

May 21, 2008    (JP) ................................. 2008-132930

(51) Int. Cl.
*G03F 9/00*    (2006.01)
(52) U.S. Cl. ............................. 430/22; 430/30; 438/401
(58) Field of Classification Search .................... 430/22, 430/30; 438/401
See application file for complete search history.

(56) References Cited

U.S. PATENT DOCUMENTS

| 6,177,330 B1 | 1/2001 | Yasuda |
| 6,338,971 B1 | 1/2002 | Yasuda et al. |

FOREIGN PATENT DOCUMENTS

| JP | 11-102851 | 4/1999 |
| JP | 2000-81712 | 3/2000 |
| JP | 2002-064046 A | 2/2002 |

OTHER PUBLICATIONS

Chinese Office Action dated Aug. 5, 2011 with an English translation.

*Primary Examiner* — Christopher Young
(74) *Attorney, Agent, or Firm* — McGinn IP Law Group, PLLC

(57) ABSTRACT

In an exposure aligning method, a first shift amount indicating a shift amount of a lower layer pattern of an exposure target substrate from an origin point position is determined and a second shift amount indicating a shift amount of the lower layer pattern in at lease one past lot which has been processed before said exposure target substrate is processed, from the origin point position is determined. A third shift amount indicating a difference between the first shift amount and the second shift amount is calculated and a first correction value is determined based on the third shift amount. An exposure position of an exposure target pattern is adjusted based on the first correction value.

14 Claims, 14 Drawing Sheets

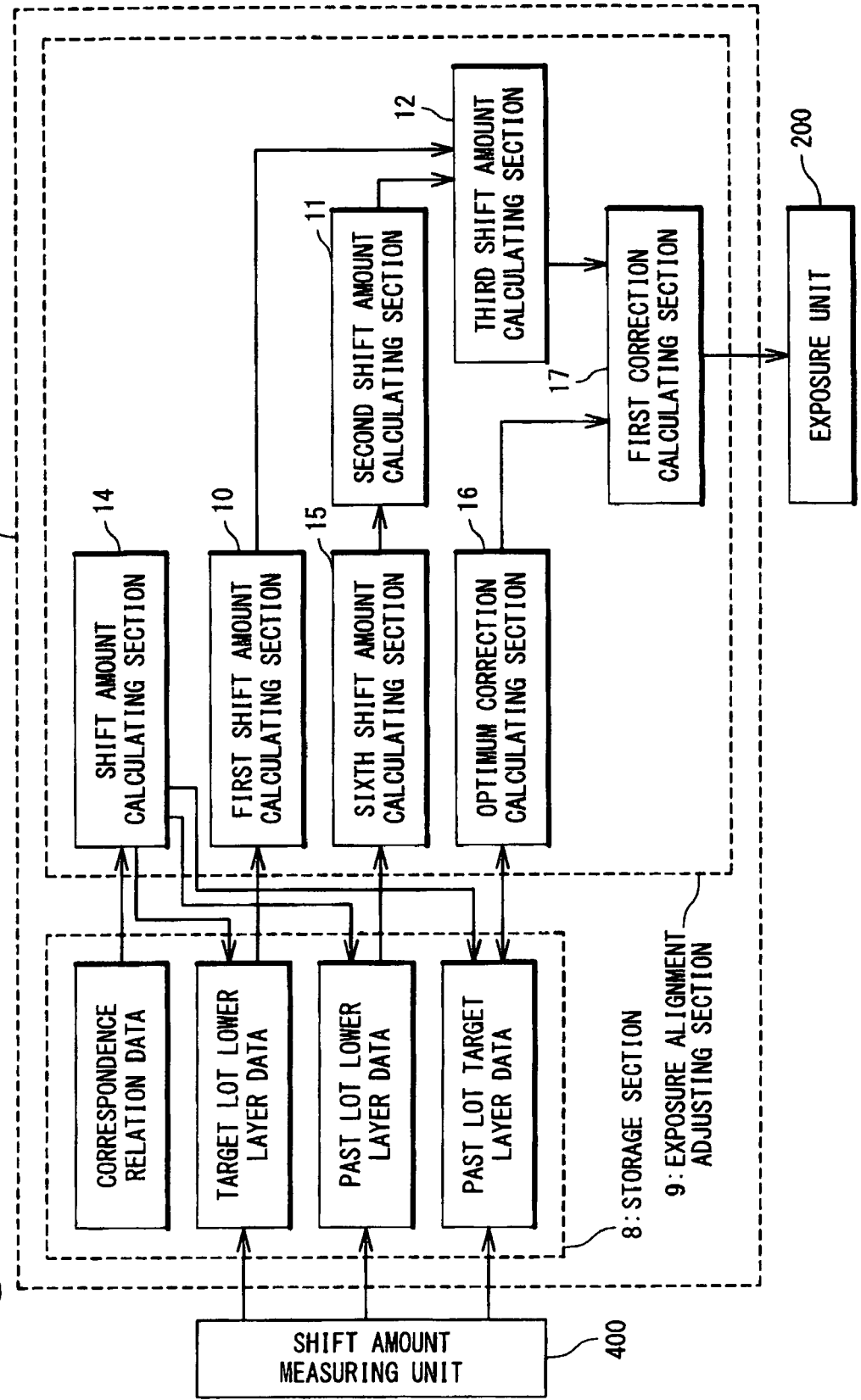

Fig. 5A

| |
|---|
| $N^{th}$ PROCESS (CURRENT PROCESS) |
| $N^{n-1}$ PROCESS |
| $N^{n-2}$ PROCESS |
| ⟩ |
| SECOND PROCESS |
| FIRST PROCESS |

Fig. 5B

| | PROCESS | LOWER PROCESS |
|---|---|---|
| | FIRST PROCESS | TARGET LAYER |
| | FIRST-A PROCESS | FIRST PROCESS |
| | FIRST-B PROCESS | FIRST PROCESS |
| LOWER LAYER | SECOND PROCESS | FIRST PROCESS |
| | ⟩ | ⟩ |
| | $N^{n-2}$ PROCESS | $N^{n-3}$ PROCESS |
| | $N^{n-1}$ PROCESS | $N^{n-2}$ PROCESS |
| TARGET LAYER | N PROCESS | $N^{n-1}$ PROCESS |

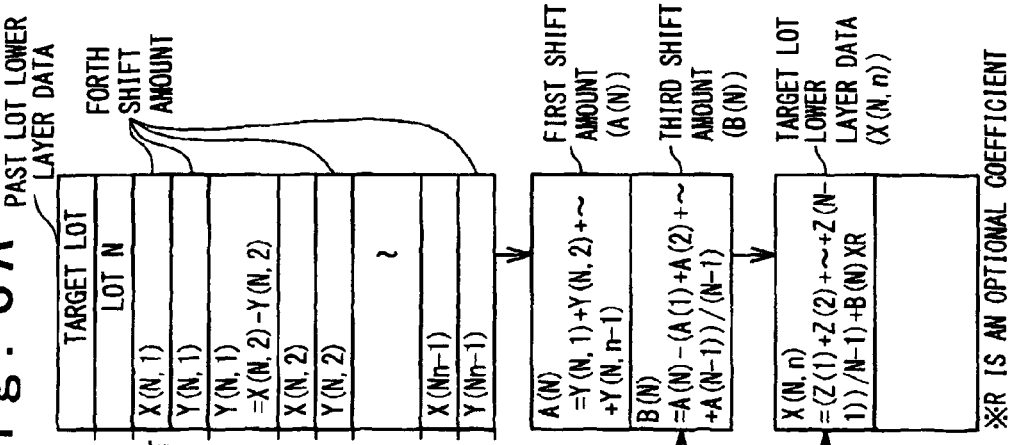

EXPOSURE ALIGNING METHOD AND EXPOSURE APPARATUS

INCORPORATION BY REFERENCE

This patent application claims priority based on Japanese Patent Application 2008-132930 filed on May 21, 2008. The disclosure thereof is incorporated herein by reference.

BACKGROUND OF THE INVENTION

1. Field of the Invention

The present invention relates to an exposure aligning method of aligning an exposure position when performing an exposure, and an exposure apparatus in which the method is realized.

2. Description of Related Art

When a pattern of an LSI circuit is formed on a semiconductor wafer, a photo-resist is used. Specifically, in forming the pattern, the photo-resist is coated on the substrate. Subsequently, light is irradiated onto the photo-resist through a reticle on which the pattern has been drawn, by an exposure apparatus. The exposure hardens or softens the photo-resist. An unnecessary portion of the photo-resist is removed after the exposure to produce the pattern. When, an etching or implantation process is performed using the produced pattern as a mask. Through this process, the pattern corresponding to one layer is formed.

In the semiconductor wafer, a plurality of patterns may be formed on a plurality of layers. In such a case, after a pattern of a first layer is formed, a film formation process of an insulating layer, a heating process, and so on is executed, and an upper layer pattern is formed by the same technique as that of the first layer. In exposing the upper layer pattern, it is necessary to adjust the relative exposure position to the lower layer pattern. In order to align the relative position of the upper layer pattern to the lower layer pattern, alignment marks are added to the lower layer pattern. When the upper layer pattern is exposed, the alignment marks in the lower layer pattern are identified and the exposure positions are determined based on the identified marks.

As a factor of a shift of the exposure position, shifts (overall shift) to an X-direction and to a Y-direction are considered when designating a substrate plane as an XY plane. The whole shifts can be corrected based on the positions of the alignment marks given to the lower layer pattern. As the factor of the shift of the exposure position, a shift of a shot component other than the whole shift can be considered. The shift of the shot component means a shift that includes a rotation of the exposure position and a telescopic shift (expansion or contraction). The shift of the shot component is produced by a manufacture error of the reticle, a mechanical error of the exposure unit, and so on.

When the exposure position is adjusted based on alignment marks, a load required to execute an aligning process at the time of exposure will increase as far as the shift of the shot component is intended to be corrected. Therefore, a correction of the shot component is omitted in some cases, when the exposure position is adjusted based on the alignment marks.

In relation to the shift of the shot component, Japanese Patent Application Publication (JP-P2000-81712A) is known, which describes an alignment correction method that includes calculating an average of actual shift amounts of a plurality of sets of products, calculating a difference of the shift amount between at least two sets of products produced consecutively, among the plurality of sets of products, and calculating an estimated stepper correction value by adding a value proportional to the shift amount of the average value.

As another technique about the shift of the shot component, Japanese Patent Application Publication (JP-A-Heisei 11-102851) is known. Japanese Patent Application Publication (JP-A-Heisei 11-102851) describes an alignment correction method in which a production system controls shift amounts from a position of reference to positions of a plurality of patterns in a semiconductor device, and the production system generates a value by adding an shift amount of its lower layer pattern corresponding to this pattern to the above-mentioned shift amount, as a stepper correction value for determining the position of the pattern.

In order to correct a shift of a shot component, it is considered to adjust an exposure position based on a pattern shift of an exposure target pattern (a shift of the exposure target pattern to the lower layer pattern) on a substrate that has been processed in past (past processed substrate), not based on alignment marks on the lower layer pattern. However, the lower layer pattern itself may have shift from the substrate having been processed in past. In this case, the shift of the lower layer pattern from the past processed substrate will be reflected to pattern shift of the exposure target pattern. Therefore, it becomes difficult to adjust the exposure position with excellent accuracy.

SUMMARY

In an aspect of the present invention, an exposure aligning method includes: determining a first shift amount indicating a shift amount of a lower layer pattern of an exposure target substrate from an origin point position; determining a second shift amount indicating a shift amount of the lower layer pattern in at lease one past lot which has been processed before said exposure target substrate is processed, from the origin point position; calculating a third shift amount indicating a difference between the first shift amount and the second shift amount; determining a first correction value based on the third shift amount; and adjusting an exposure position of an exposure target pattern based on the first correction value.

In another aspect of the present invention, an exposure apparatus is includes: a storage unit; an exposure unit; a shift amount measuring unit configured to measure a first shift amount as a shift amount of a lower layer pattern of an exposure target substrate from an origin point position, and a second shift amount as a shift amount of the lower layer pattern in at lease one past lot which has been processed before said exposure target substrate is processed, from the origin point position, and to store in said storage unit; and an exposure alignment adjusting section configured to read out the first and second shift amounts to calculate a third shift amount indicating a difference between the first shift amount and the second shift amount, to determine a first correction value based on the third shift amount, and to adjust said exposure unit based on the first correction value so as to adjust an exposure position of an exposure target pattern.

In still another aspect of the present invention, a computer-readable recording medium in which a computer-readable program is recorded to realize an exposure aligning method which includes: determining a first shift amount indicating a shift amount of a lower layer pattern of an exposure target substrate from an origin point position; determining a second shift amount indicating a shift amount of the lower layer pattern in at lease one past lot which has been processed before said exposure target substrate is processed, from the origin point position; calculating a third shift amount indicating a difference between the first shift amount and the second shift amount; determining a first correction value based on the third shift amount; and adjusting an exposure position of an exposure target pattern based on the first correction value.

According to the present invention, the exposure aligning method that can adjust the exposure position with excellent accuracy, and the exposure apparatus thereby are provided.

BRIEF DESCRIPTION OF THE DRAWINGS

The above and other objects, advantages and features of the present invention will be more apparent from the following description of certain embodiments taken in conjunction with the accompanying drawings, in which:

FIG. 4 is a block diagram showing a control system in the present invention;

FIGS. 5A and 5B are conceptual diagrams showing correspondence relation data;

FIGS. 8A to 8C are conceptual diagrams showing data stored in a storage section;

DESCRIPTION OF THE PREFERRED EMBODIMENTS

Figure 1:
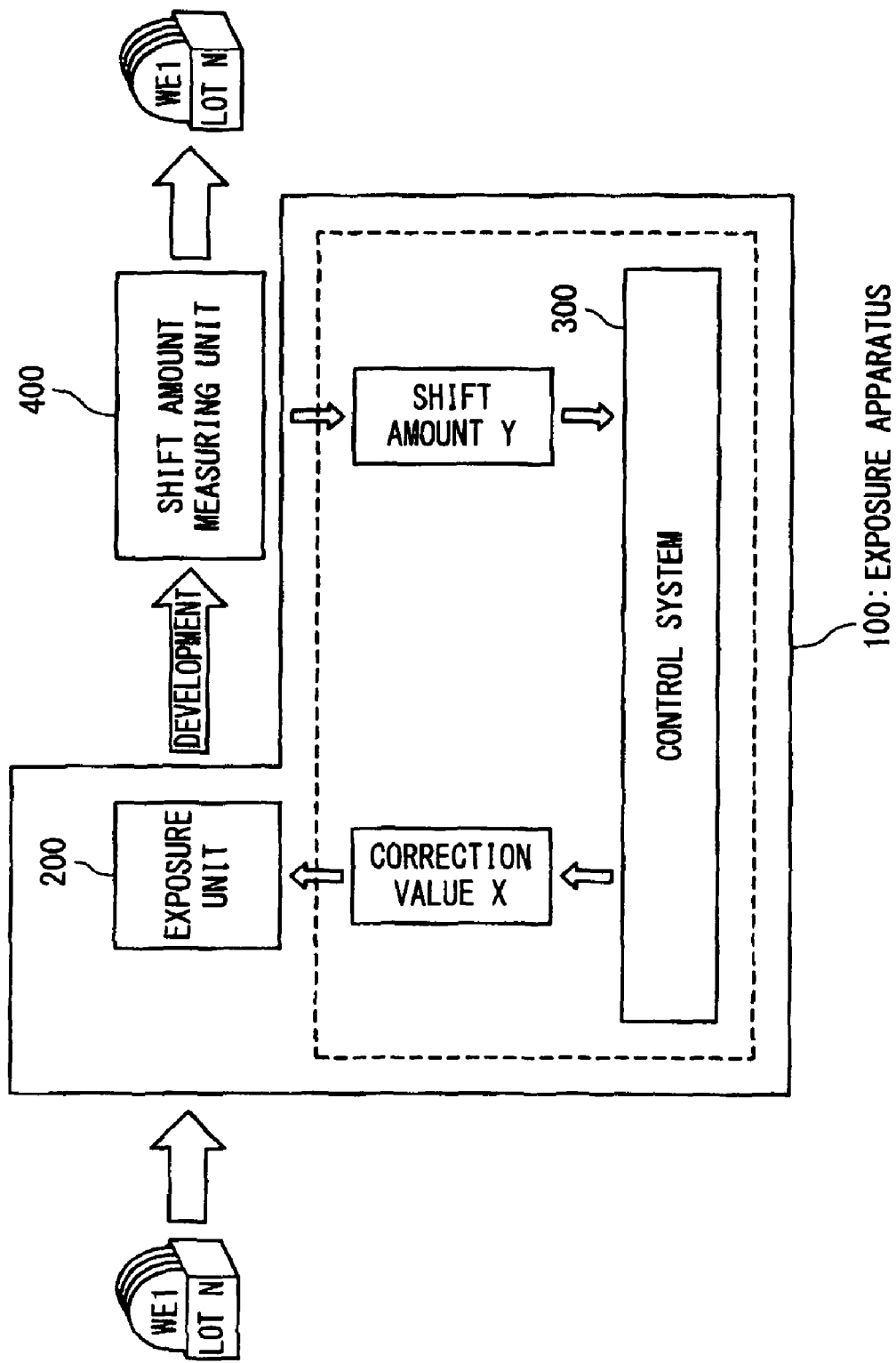
FIG. 1 is a block diagram showing an exposure apparatus according to the present invention.

Hereinafter, an exposure apparatus according to the present invention will be described with reference to the attached drawings. FIG. 1 is a diagram schematically showing the exposure apparatus 100 according to the present embodiment. This exposure apparatus 100 is used when a semiconductor device is manufactured to have a plurality of circuit patterns stacked in a plurality of layers. A photo-resist formed on a semiconductor wafer is subjected to an exposing process by the exposure apparatus 100. Then, a developing process is performed to the semiconductor wafer. After the developing process, a pattern shift amount of a pattern formed with the photo-resist is measured by a pattern shift measuring unit 400. The pattern shift amount is a shift amount between a lower layer pattern and a pattern formed thereon. The pattern shift amount measured by the shift amount measuring unit 400 is notified to the exposure apparatus 100.

The exposure apparatus 100 is provided with a control system 300 and an exposure unit 200. The control system 300 has a function of adjusting an exposure position. The control system 300 adjusts the exposure position based on the pattern shift amount. The control system 300 is a computer and realizes its function by a CPU performing an exposure alignment control program stored in ROM (read only memory), into which the program is loaded from a recording medium.

Figure 2:
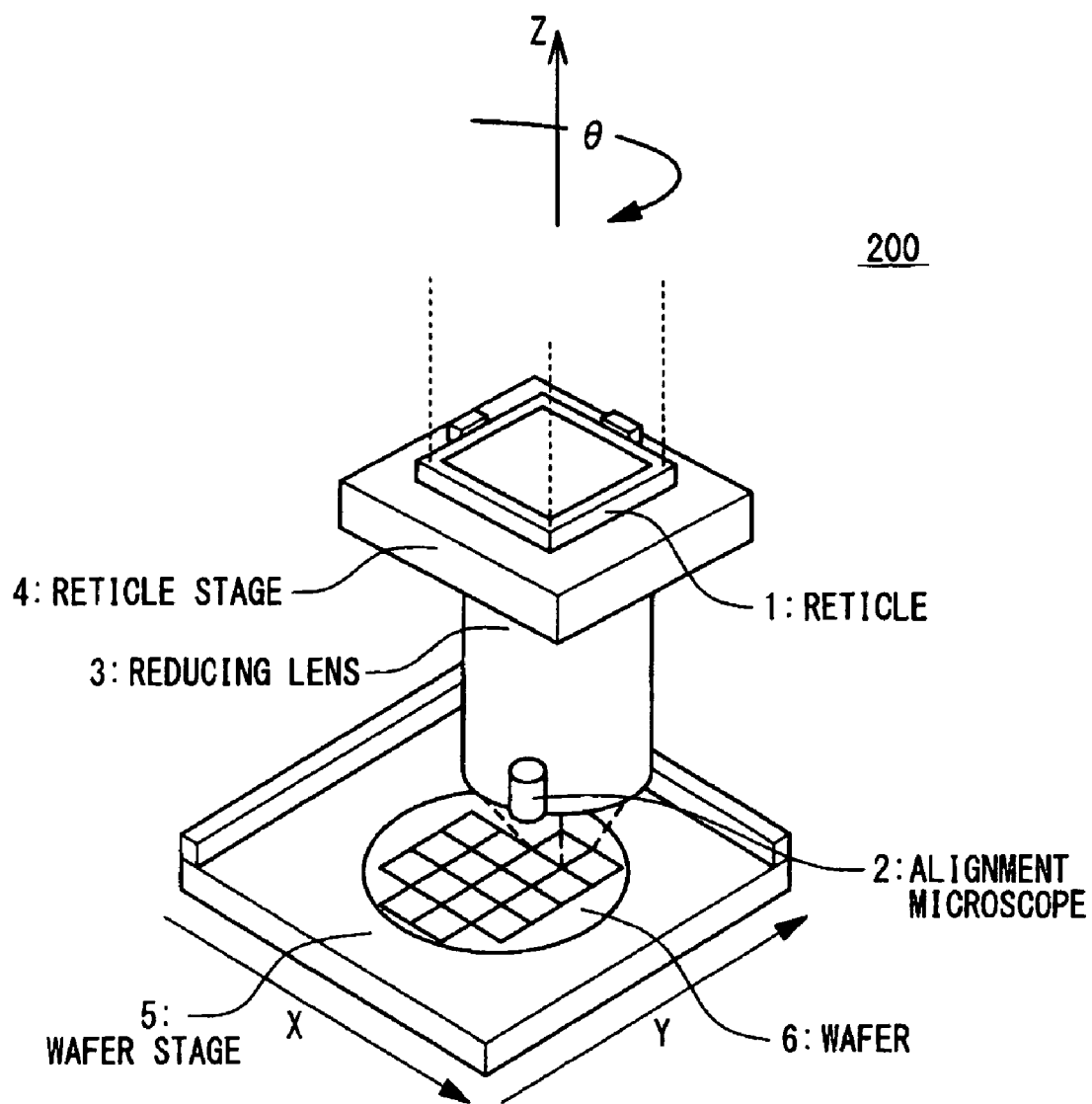
FIG. 2 is a perspective view showing an exposure unit.

FIG. 2 is a perspective view showing the exposure unit 200. The exposure unit 200 prints or exposes a circuit pattern drawn on a reticle 1 onto the photo-resist on a semiconductor wafer 6. The exposure unit 200 has a reticle stage 4 on which a reticle 1 is mounted, an alignment microscope 2, a reducing lens 3 that thins a flux of light from a light source (not illustrated) and projects it onto the semiconductor wafer 6, and a wafer stage 5 on which the semiconductor wafer 6 is placed.

As shown in FIG. 2, an XY plane is defined as a plane parallel to the semiconductor wafer 6. Moreover, a direction perpendicular to the XY plane is defined as a Z-direction. The wafer stage 5 is movable in an X-direction, and a Y-direction. By moving the wafer stage 5, the exposure unit adjusts the exposure position in the X-direction or the Y-direction. The reticle stage 4 is rotatable about the Z-axis. By rotating the reticle stage 4 about the Z-axis, the exposure position rotates. Moreover, the reducing lens 3 is movable along the Z-axis. By moving the reducing lens 3 along the Z-axis, the exposure position is expanded or contracted.

Figure 3:
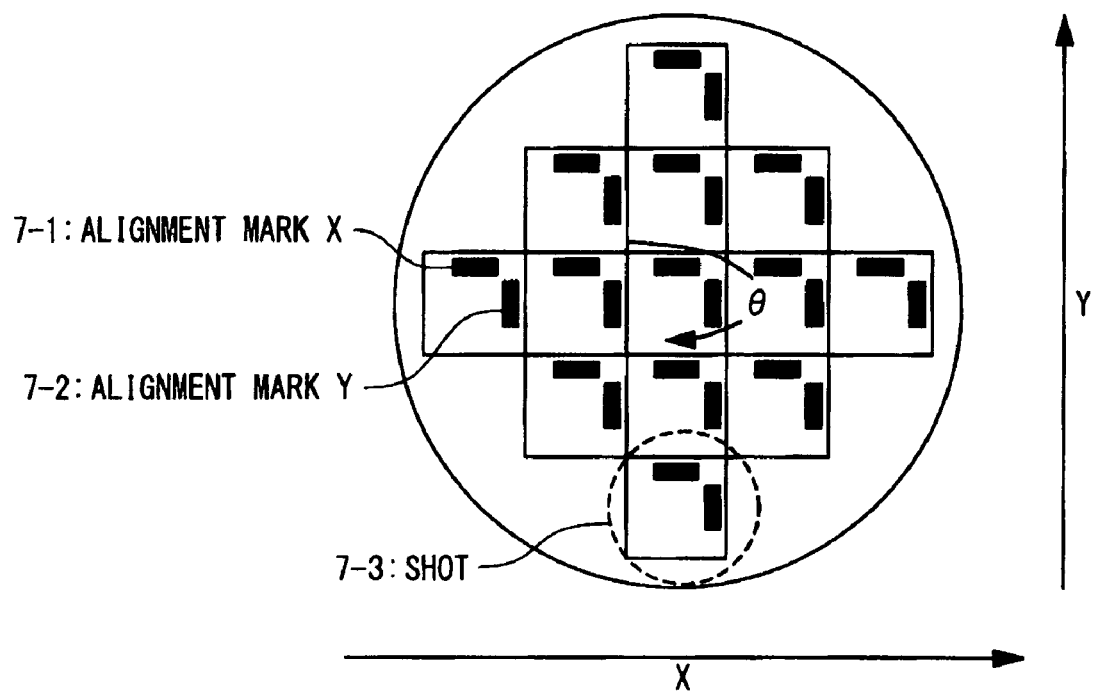
FIG. 3 is a plan view showing a lower layer pattern.

FIG. 3 is a diagram schematically showing the lower layer pattern formed on the semiconductor wafer 6. As shown in FIG. 3, an alignment mark 7-1 that indicates a reference position of the X-direction, and an alignment mark 7-2 that indicates a reference position of the Y-direction are formed in a shot 7-3 on the lower layer pattern. At the time of exposure, the alignment marks (7-1, 7-2) of the lower layer pattern are identified and detected by the alignment microscope. The exposure unit 200 aligns relative positions of the reticle 1 and the lower layer pattern by moving the wafer stage 5 and performs the exposing process.

However, there is a case that it is difficult to align the relative positions of the reticle 1 and the lower layer pattern through the correction using the alignment marks, due to a reticle manufacture error and a mechanical error of the exposure unit. Specifically, a shift of the shot component (a shift of a rotation direction about the Z-axis and a shift related to expansion or contraction) may be generated as a difference.

In the present embodiment, since the shift is corrected by a method other than the method of using the alignment marks, a correction value at the time of the exposing process to an exposure target lot N is determined based on the pattern shift amount in a lot processed in the past. Here, the pattern shift amount is calculated with respect to the position of a corresponding lower layer pattern. Therefore, in the exposure target lot N, if the position of the lower layer pattern that serves as a reference shifts from that of the past lot, the shift will be reflected to the pattern shift amount of the exposure target pattern in the exposure target lot N. Therefore, in the present embodiment, the control system 300 further corrects the shift of the lower layer pattern itself from the past lot.

In summary, the control system 300 calculates the shift amount of the lower layer pattern from an origin position as a first shift amount in the exposure target lot N. The origin position is a position set up in advance. Moreover, a shift amount of the lower layer pattern from the origin position is similarly calculated as a second shift amount in a past lot group processed in past. Further, a difference between the first shift amount and the second shift amount is calculated as a third shift amount. This third shift amount is a data indicating how much the lower layer pattern itself is shifted from that of the past lot. The control system 300 reflects this third shift amount to the correction value when the exposure target pattern is exposed. Thereby, the position shift of the lower layer pattern from the past lot is corrected.

Below, a specific configuration of the control system 300 will be described. FIG. 4 is a block diagram showing the configuration of the control system 300. The control system 300 is provided with an exposure alignment adjustment section 9 and a storage section 8. The exposure alignment adjustment section 9 realizes its function based on an exposure alignment control program loaded from a recording medium (not shown). The storage section 8 is exemplified by a hard disk drive etc. The storage section 8 stores data of a pattern shift amount, a correction value of the exposure position, and so on. The exposure alignment adjusting section 9 calculates a first correction value based on the data stored in the storage section 8. The calculated first correction value is notified to the exposure unit 200. The exposure unit 200 adjusts the exposure position based on the first correction value and executes an exposing process.

The data stored in the storage section 8 will be described. The storage section 8 stores correspondence relation data, target lot lower layer data, past lot lower layer data, and past lot target layer data.

FIGS. 5A and 5B are conceptual diagrams showing the correspondence relation data. As shown in FIG. 5A, the correspondence relation data contains data indicating what is a pattern to be currently exposed (to be referred to as an exposure target pattern). A pattern of a layer is formed in a process. In FIG. 5A, a current process is an $n^{th}$ process. That is, it is shown that the exposure target pattern is a pattern that is formed in the $n^{th}$ process (a pattern of the $n^{th}$ layer). Moreover, the correspondence relation data contains a lower layer serving as a reference at the time of measurement of the pattern shift amount (a ground process) for the each process, as shown in FIG. 5B. In an example of FIG. 5B, the lower layer of a second process is a pattern formed in a first process. That is, a pattern shift amount of a pattern formed in the second process is measured by the shift amount measuring unit 400 by using the pattern formed in the first process as the lower layer. It should be noted that a pattern serving as the lower layer has not been yet formed in the first process. The pattern shift amount in the first process is expressed with respect to a predetermined position (an origin position). The pattern shift amount in the first process cannot be measured by the shift amount measuring unit 400. The pattern shift amount in the first process is calculated by the exposure alignment adjustment section 9.

A first (a) process and a first (b) process are a process of exposing the photo-resist for mask formation at the time of ion implantation and so on. Like the second process, these processes use the pattern formed in the first process as the lower layer. In the first (a) process and the first (b) process, it is not a case where the pattern is apparently formed. Although the second process is performed after the first (a) process and the first (b) process, the shift amount measuring unit 400 measures its pattern shift amount by using the pattern formed in the first process as the lower layer. The pattern shift amount used in the present embodiment is a pattern shift amount of the shot component. The pattern shift amount of the shot component will be described with reference to FIGS. 6A to 6C and 7A to 7C. The pattern shift amount of the shot component contains a pattern shift amount of shot rotation and a pattern shift amount of shot reduction.

Figure 6A:
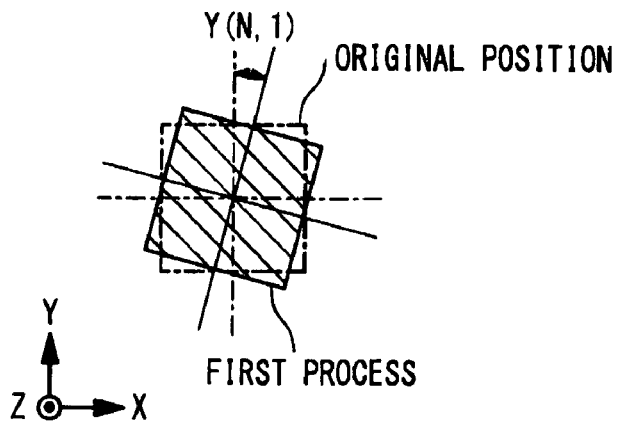
FIGS. 6A to 6C are conceptual diagrams showing a pattern shift amount of shot rotation.
Figure 6B:
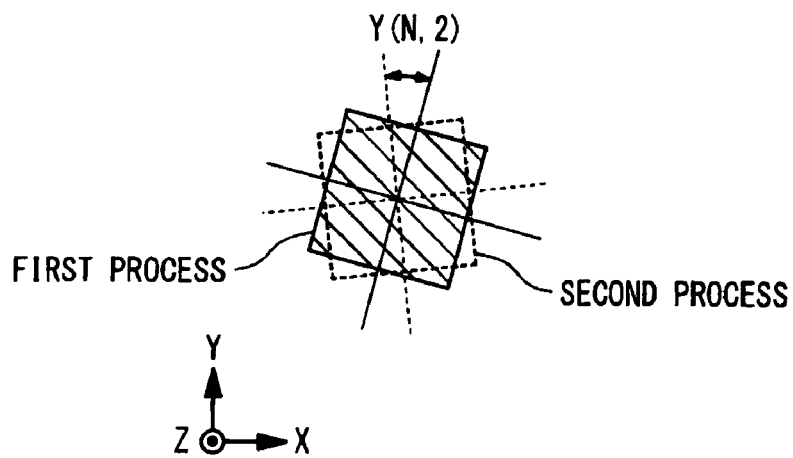
Figure 6C:
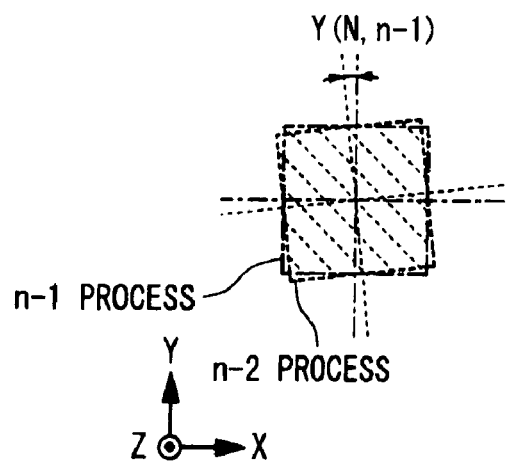

FIGS. 6A to 6C are diagrams showing the pattern shift amount due to the shot rotation. The pattern shift amount due to the shot rotation is a pattern shift amount in a rotation about the Z-axis. FIG. 6A shows the pattern shift amount "Y(N, 1)" due to the shot rotation in the first process. As shown in FIG. 5B, the pattern shift amount "Y(N, 1)" in the pattern formed in the first process is expressed as an angle about the Z-axis with respect to the predetermined position (the origin position). FIG. 6B shows the pattern shift amount "Y(N, 2)" of the pattern formed in the second process. The lower layer of the second process is formed in the first process (see FIG. 5B). Therefore, the pattern shift amount "Y (N, 2)" in the pattern formed in the second process is expressed as an angle about the Z-axis with respect to the pattern formed in the first process. FIG. 6C shows the pattern shift amount "Y(N, n−1)" of the pattern formed in the $(n-1)^{th}$ process. The lower layer of the $(n-1)^{th}$ process is formed in the $(n-2)^{th}$ process (refer to FIG. 5B). Therefore, the pattern shift amount in the $(n-1)^{th}$ process "Y(N, n−1)" is shown with respect to the pattern formed in the $(n-2)^{th}$ process.

Figure 7A:
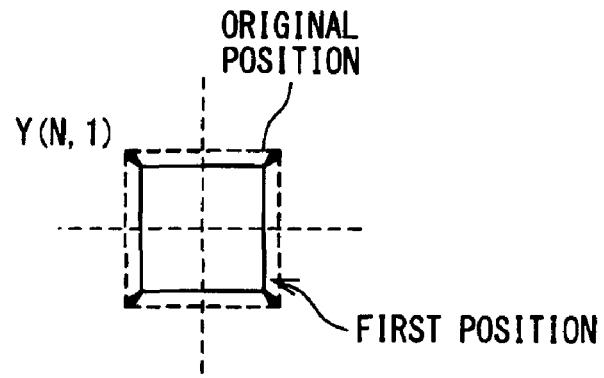
FIGS. 7A to 7C are conceptual diagrams showing the pattern shift amount of shot reduction.
Figure 7B:
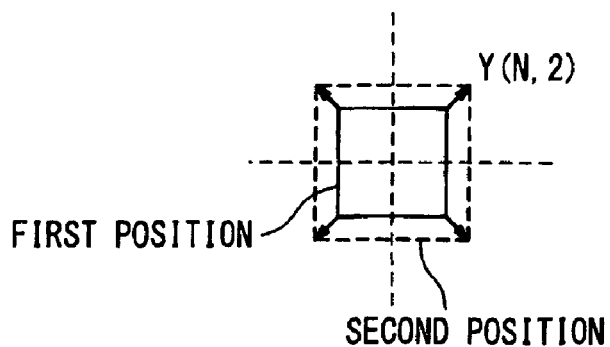
Figure 7C:
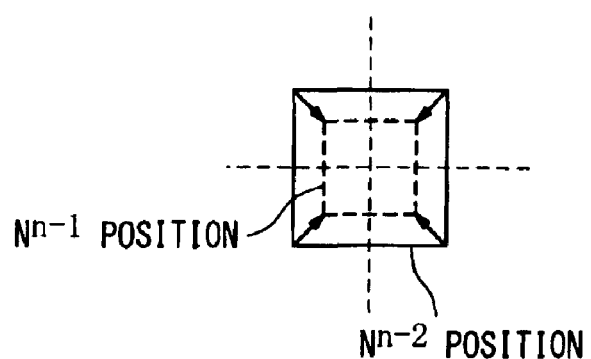

FIGS. 7A to 7C are diagrams showing the pattern shift amount due to the shot reduction. The pattern shift amount due to the shot reduction is shown as an amount of expansion or contraction from the reference position. FIG. 7A shows the pattern shift amount "Y(N, 1)" due to the shot reduction in the first process. As shown in FIG. 5B, the pattern shift amount of the pattern formed in the first process is expressed with respect to the predetermined position (the origin position). FIG. 7B shows the pattern shift amount "Y(N, 2)" of the pattern formed in the second process. The lower layer of the second process is formed in the first process (refer to FIG. 5B). Therefore, the pattern shift amount in the second process is shown with respect to the pattern formed in the first process. FIG. 7C shows the pattern shift amount "Y(N, n−1)" of the pattern formed in the $(n-1)^{th}$ process. The lower layer of the $(n-1)^{th}$ process is formed in the $(n-2)^{th}$ process (refer to FIG. 5B). Therefore, the pattern shift amount in the $(n-1)^{th}$ process is shown with respect to the pattern formed in the $(n-2)^{th}$ process.

Next, referring to FIGS. 8A to 8C, the target lot lower layer data, the past lot lower layer data, and the past lot target layer data will be described.

In FIG. 8A, the target lot lower layer data is shown. The target lot lower layer data is data of an exposure target lot N, and is data of a pattern formed in a layer lower than an exposure target pattern. As shown in FIG. 8A, the target lot lower layer data shows a correction value X of the exposure position applied at the time of the exposure, and the pattern shift amount Y of the formed pattern (a fourth shift amount), for each of the processes from the first process to the $(n-1)^{th}$ process. The pattern shift amount of the pattern formed in each layer is an amount of shift from the lower layer pattern corresponding to the layer. The correction value X is notified to the storage section 8 from the exposure unit 200 when it executes the exposing process, and is stored there. When a plurality of wafers exist in one lot, an average value may be used as the correction value X or the pattern shift amount Y.

FIG. 8B is a conceptual diagram showing the past lot lower layer data. The past lot lower layer data is data of a past lot group, and is data of the pattern formed in a layer lower than the exposure target pattern. Similarly to the target lot lower layer data, the past lot lower layer data also shows the correction value X and the pattern shift amount Y (the fifth shift amount) for each of the processes from the first process to the $(n-1)^{th}$ process.

FIG. 8C is a conceptual diagram showing the past lot target layer data. The past lot target layer data is data of the exposure target pattern in the past lot group. The past lot target layer data shows the correction value when the exposure target pattern is exposed, the pattern shift amount Y of the exposure target pattern actually formed for the past lot group, and an optimum correction value Z. The optimum correction value Z indicates an ideal correction value, showing such a correction value as the pattern shift amount of the formed pattern being zero. The optimum correction value is calculated as a difference between an actually applied correction value X and the pattern shift amount Y of an actually formed pattern.

Returning to FIG. 4, the exposure alignment adjustment section 9 will be described. The exposure alignment adjustment section 9 has a first shift amount calculating section 10, a second shift amount calculating section 11, a third shift amount calculating section 12, a shift amount calculating section 14, a sixth shift amount calculating section 15, an optimum correction value calculating section 16, and a first correction value calculating section 17.

When the shift amount calculating section 14 cannot measure a pattern shift amount by the shift amount measuring unit 400, the shift amount calculating section 14 finds the pattern shift amount through calculation. For example, regarding the first layer pattern, since a pattern serving as the lower layer does not exist, the pattern shift amount Y cannot be measured. In this case, when a pattern (an upper layer pattern) over the first layer pattern serving as the lower layer is formed, the shift amount calculating section 14 calculates a difference between the pattern shift amount of the upper layer pattern and the correction value applied at the time of formation of the upper layer pattern to find the pattern shift amount of the first layer pattern. That is, when a pattern of the lower layer corresponding to the $n^{th}$ layer pattern does not exist, the shift amount calculating section 14 finds a fourth shift amount of the $n^{th}$ layer based on a correction value applied when exposing an $(n+\alpha)^{th}$ layer pattern over the $n^{th}$ layer pattern serving as the lower layer and a difference from the position of the pattern actually formed as the $(n+\alpha)^{th}$ layer.

The first shift amount calculating section 10 calculates the shift amount of the lower layer pattern corresponding to the exposure target pattern from the origin position as the first shift amount A(N) for the exposure target lot. Specifically, the first shift amount calculating section 10 calculates the first shift amount A(N) by summing the pattern shift amounts Ys from the first layer to the $(n-1)^{th}$ layer of the lower layer pattern. In this case, the pattern shift amounts of the patterns formed through the first (a) process, the first (b) process, and so on are not taken into consideration, since otherwise they would be integrated repeatedly.

The sixth shift amount calculating section 15 calculates a shift amount of the lower layer pattern corresponding to the exposure target pattern from the origin position as a sixth shift amount A(N) for the past lot group. When a plurality of lots exist in the past lot group, the sixth shift amount calculating section 15 calculates the sixth shift amount for each of the plurality of lots. Similarly to the first shift amount, the sixth shift amount is found by summing the pattern shift amounts of the patterns from the first layer to the $(n-1)^{th}$ layer.

The second shift amount calculating section 11 calculates an average of the sixth shift amounts in the past lot group as the second shift amount.

The third shift amount calculating section 12 calculates a difference between the first shift amount and the second shift amount as the third shift amount. The calculated third shift amount will indicate how much the position of the lower layer pattern $((n-1)^{th}$ layer pattern) displaces from the past lot group.

The optimum correction value calculating section 16 refers to the past lot target layer data, and calculates the optimum correction value based on both the correction value X applied at the time of exposure of the exposure target pattern and the pattern shift amount Y of the exposure target pattern having been formed. The calculated optimum correction value is stored in the past lot target layer data. Moreover, the optimum correction value calculating section 16 calculates an average of the optimum correction values (the averaged optimum correction value) in the past lot group.

The first correction value calculating section 17 calculates the first correction value based on the optimum correction value stored in the past lot target layer data and the third shift amount. The calculated first correction value is notified to the exposure unit 200.

Figure 9:
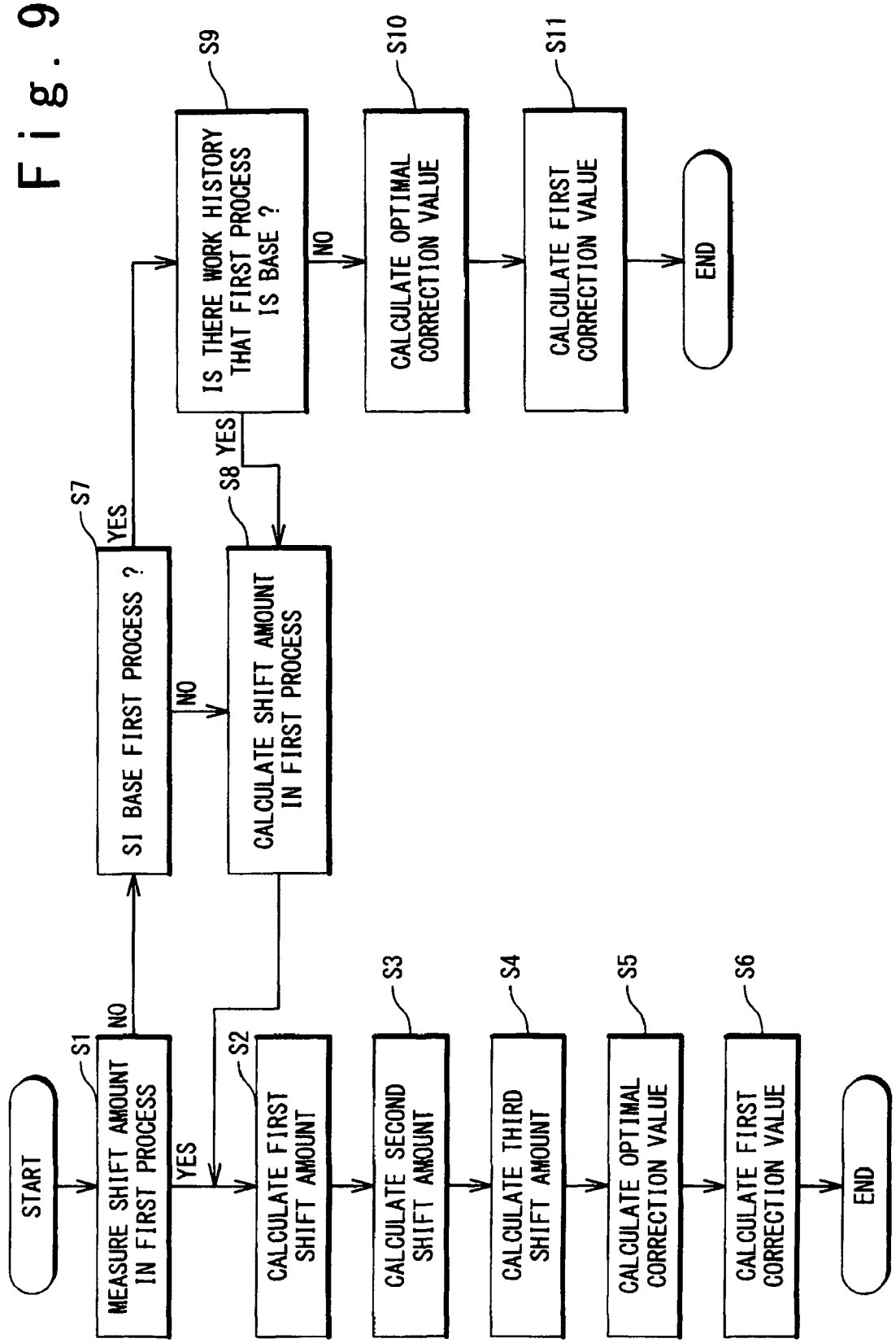
FIG. 9 is a flow chart showing an exposure aligning method.

Next, referring to FIGS. 8A to 8C and 9, the exposure aligning method according to the present embodiment will be described. FIG. 9 is a flow chart of the exposure aligning method. In addition, FIGS. 8A to 8C show a data flow in the exposure aligning method.

Step S1: Is the Pattern Shift Amount of the First Process Measured?

First, the first shift amount calculating section 10 refers to the target lot lower layer data and determines whether the pattern shift amount of the first layer pattern (the fourth shift amount) is stored. That is, it is determined whether the pattern shift amount Y of the first process is stored.

Step S2: Calculation of the First Shift Amount

When the pattern shift amount Y of the first layer pattern is stored, the first shift amount calculating section 10 refers to the target lot lower layer data and calculates a summation of the pattern shift amounts Ys from the first layer to the $(n-1)^{th}$ layer. Thereby, the first shift amount A(N) is calculated. The first shift amount A(N) will indicate the shift amount of the lower layer pattern $((n-1)^{th}$ layer pattern) corresponding to the exposure target pattern from the origin position.

Step S3: Calculation of the Second Shift Amount

After the first shift amount A(N) is calculated at Step S2, the second shift amount is calculated. Specifically, at first, the sixth shift amount calculating section 15 calculates a summation of the pattern shift amounts (fifth shift amounts) in one past lot based on the past lot lower layer data as the sixth shift amount A(N) (N=1, 2, . . . , N-1) of the past lot. The calculated sixth shift amount will indicate the shift amount of the lower layer pattern (a pattern of the $(n-1)^{th}$ layer) from the origin position, similarly to the first shift amount A(N). Next, the second shift amount calculating section 11 calculates an average of the sixth shift amounts in the past lot group "(A(1)+A(2)+ . . . +A(N-1))/(N-1)" as the second shift amount.

Step S4: Calculation of the Third Shift Amount

Next, the third shift amount calculating section 12 calculates the third shift amount B(N) based on the first shift amount A(N) and the second shift amount "(A(1)+A(2)+ . . . +A(N-1))/(N-1)." Specifically, the third shift amount calculating section 12 calculates a difference between the first shift amount and the second shift amount "A(N)-(A(1)+A(2)+ . . . +A(N-1))/(N-1)" as the third shift amount B(N). The calculated third shift amount B(N) will indicate how much the lower layer pattern (the pattern of the $(n-1)^{th}$ layer) is shifted from the lot processed in the past in the exposure target lot N.

Step S5: Calculation of the Optimum Correction Value

Next, the optimum correction value calculating section 16 calculates an optimum correction value based on the past lot target layer data. Specifically, the optimum correction value calculating section 16 calculates a difference between the correction value X and the pattern shift amount Y in the exposure target pattern of the past lot group as an optimum correction value "Z(N) (N=1, 2, . . . , N-1)." Moreover, the optimum correction value calculating section 16 calculates an average value of the optimum correction values of the past lot group "(Z(1)+Z(2)+ . . . +Z(N-1))/(N-1)."

Step S6: Calculation of the First Correction Value

Next, the first correction value calculating section 17 calculates the first correction value X(N) based on the third shift amount B(N) and the optimum correction value "Z(N) (N=1, 2, . . . , N-1)." Specifically, the first correction value calculating section 17 calculates a sum of a value obtained by multiplying the third shift amount B(N) by a predetermined coefficient R and the average value of the optimum correction values "(Z(1)+Z(2)+ . . . +Z(N-1))/(N-1)" as the first correction value X(N). The calculated first correction value X(N) is notified to the exposure unit 200. The exposure unit 200 adjusts the exposure position based on the first correction value X(N), and exposes the exposure target pattern N.

Step S7: Is the Lower Layer Formed by the First Process?

On the other hand, at Step S1, when the pattern shift amount Y of the first layer pattern is not stored, the shift amount calculating section 14 refers to the correspondence relation data and determines whether the lower layer of the exposure target pattern is a pattern formed in the first process.

Step S8: Calculation of the Pattern Shift Amount in the First Process

When the lower layer of the exposure target pattern is not the pattern formed in the first process, the shift amount calculating section 14 refers to the correspondence relation data. Then, the shift amount calculating section 14 selects a process of using the pattern formed in the first process as the lower layer. The shift amount calculating section 14 refers to the target lot lower layer data and calculates a difference between the pattern shift amount of the pattern formed in the selected process and the correction value X applied in the selected process as the pattern shift amount in the first process. The calculated shift amount in the first process is stored in the target lot lower layer data. Then, the process flow of Step S2 and thereafter is performed. By executing such processes, the pattern shift amount of the first layer pattern in which a pattern serving as the lower layer does not exist can also be found by calculation.

Step S9: Does a Process History that the Lower Layer is Formed in the First Process Exist?

When a result of determination at Step S7 indicates that the lower layer of the exposure target pattern is the pattern formed in the first process, it is determined whether the process history of another process in which the lower layer pattern is the pattern formed in the first process exists in the storage section 8. For example, as shown in FIG. 5B, it is determined whether the process histories (a measurement result of the pattern shift amount and so on) of the first (a) process, the first (b) process, and so on exist. When the process history exists, the same process as Step S8 is executed by using the measurement result of the pattern shift amount in the process history, to calculate the pattern shift amount in the first process.

Steps S10 and S11: Calculation of the Optimum Correction Value, and Calculation of the First Correction Value On the other hand, when the process history of the first process of the lower layer does not exist at Step S9, the processes of Steps S2 to S5 are not executed, but only calculation of the optimum correction value is executed (Step S10). Then, the first correction value X(N) is calculated based on the optimum correction value (Step S11). At this time, the third shift amount is not reflected to the first correction value X(N).

FIGS. 10 to 13 are diagrams showing the effect of the present embodiment.

Figure 10:
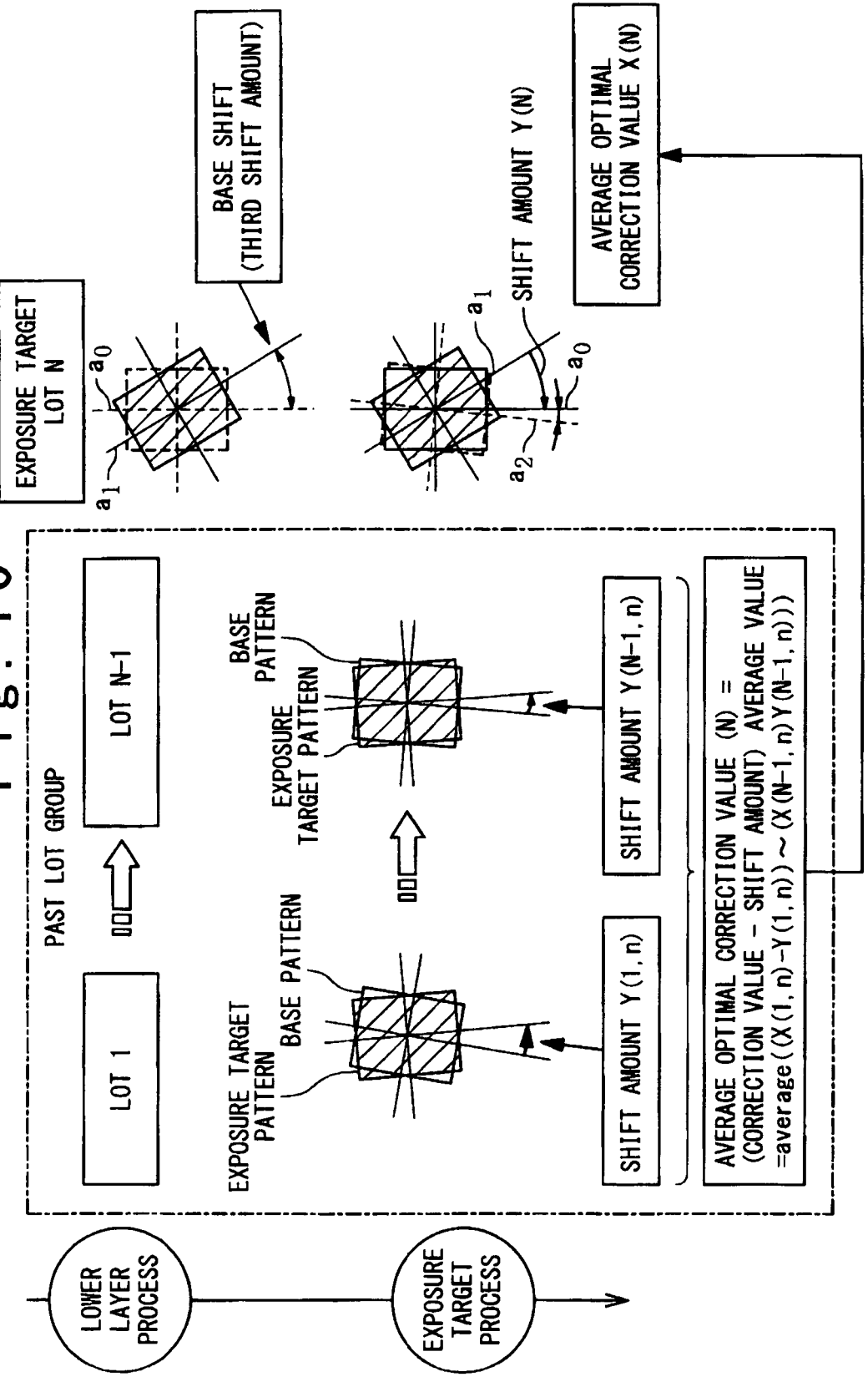
FIGS. 10 to 13 are diagrams showing an operation of the exposure apparatus according to an embodiment of the present invention.
Figure 11:
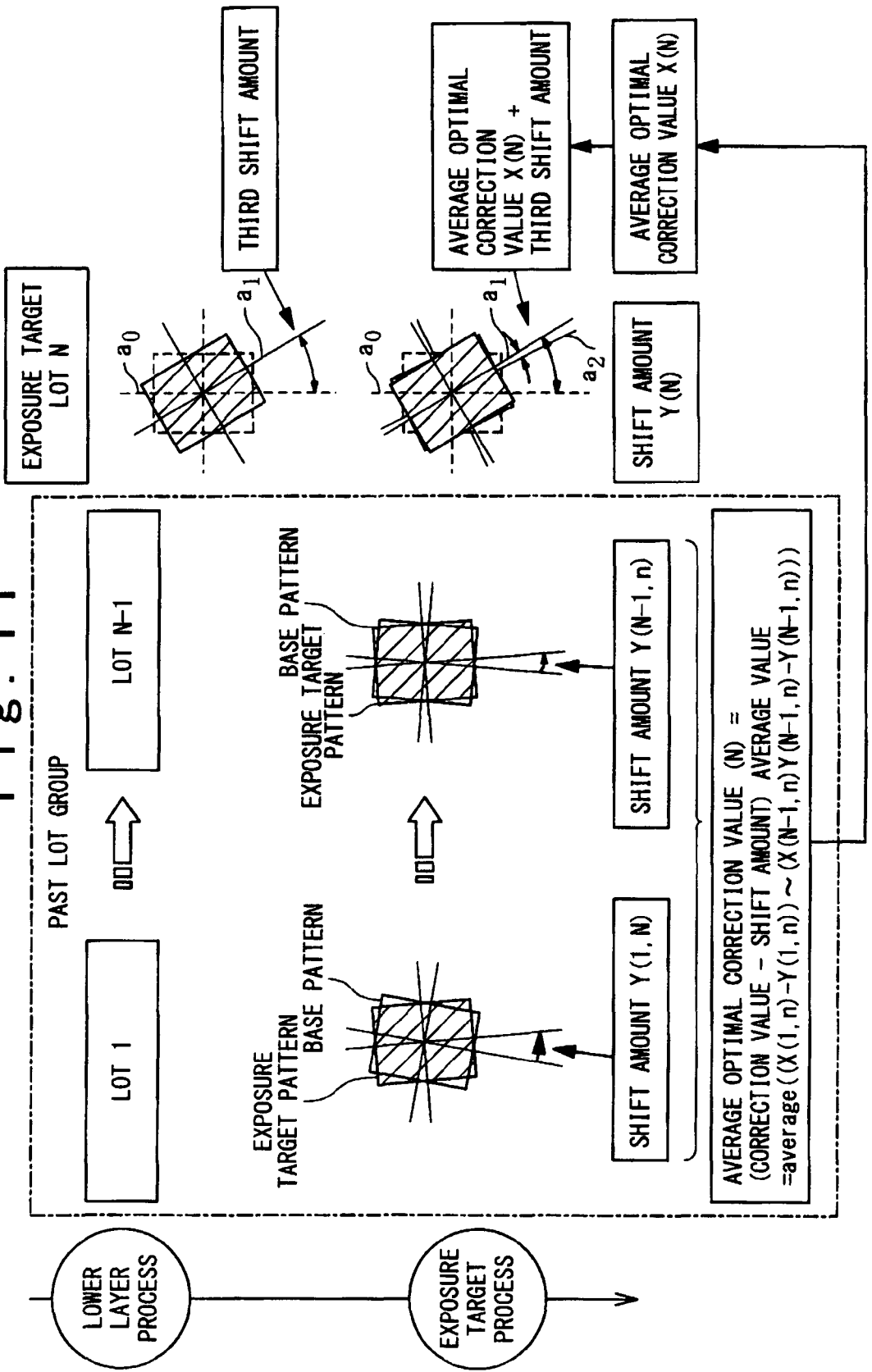

FIGS. 10 and 11 are diagrams showing the shot rotation. FIG. 10 is for the comparison with the present embodiment and shows a state when the third shift amount is not reflected at the time of exposure of an exposure target pattern (a2) in the exposure target lot N. FIG. 10 shows a spatial relationship among a lower layer pattern (a0) formed in the past lot group, a lower layer pattern (a1) formed in the exposure target lot N, and the exposure target pattern (a2) that is exposed in the exposure target lot N. The exposure target pattern (a2) is determined based on the averaged optimum correction value X of the exposure target pattern in the past lot group. The averaged optimum correction value X is a value calculated based on both of the pattern shift amount of the actually formed exposure target pattern in the past lot group and the actually applied correction value X. Ideally, by using the averaged optimum correction value X, the pattern (a2) is made to be coincident with the pattern (a0) (practically a shift arises also between the pattern (a2) and the pattern (a0)). However, even if a shift between the pattern (a2) and the pattern (a0) is zero, a shift will arise also between the pattern (a2) and the pattern (a1) when a shift (the third shift amount) has arisen between the pattern (a1) and the pattern (a0). That is, the pattern shift will arise in the exposure target pattern in the exposure target lot N.

FIG. 11 is a diagram showing the shot rotation in the present embodiment. FIG. 11 shows a relative spatial relationship among the exposure target pattern (a2) in the exposure target lot N, the lower layer pattern (a1) corresponding to the exposure target pattern, and the lower layer pattern (a0) in the past lot group. According to the present embodiment, in addition to the averaged optimum correction value, the third shift amount is reflected to the exposure position of the exposure target pattern (a2). By the third shift amount being reflected, the shift of the lower layer pattern (a1) from the past lot group is cancelled. As a result, a shift between the pattern (a2) and the pattern (a1) (the pattern shift amount of the exposure target pattern in the exposure target lot N) can be made small.

When FIG. 10 and FIG. 11 are compared with each other, it could be understood in the present embodiment that the exposure position can be adjusted with excellent accuracy by reflecting a shift amount of the lower layer pattern (a1) from the past lot group (the third shift amount) to the exposure position of the exposure target pattern (a2). It should be noted that there is a case that in spite of reflecting the third shift amount, the pattern shift amount may arise practically in the exposure target pattern (a2). This shift is measured by the shift amount measuring unit 400, and is used when the upper layer is formed by using this exposure target pattern as the lower layer.

Figure 12:
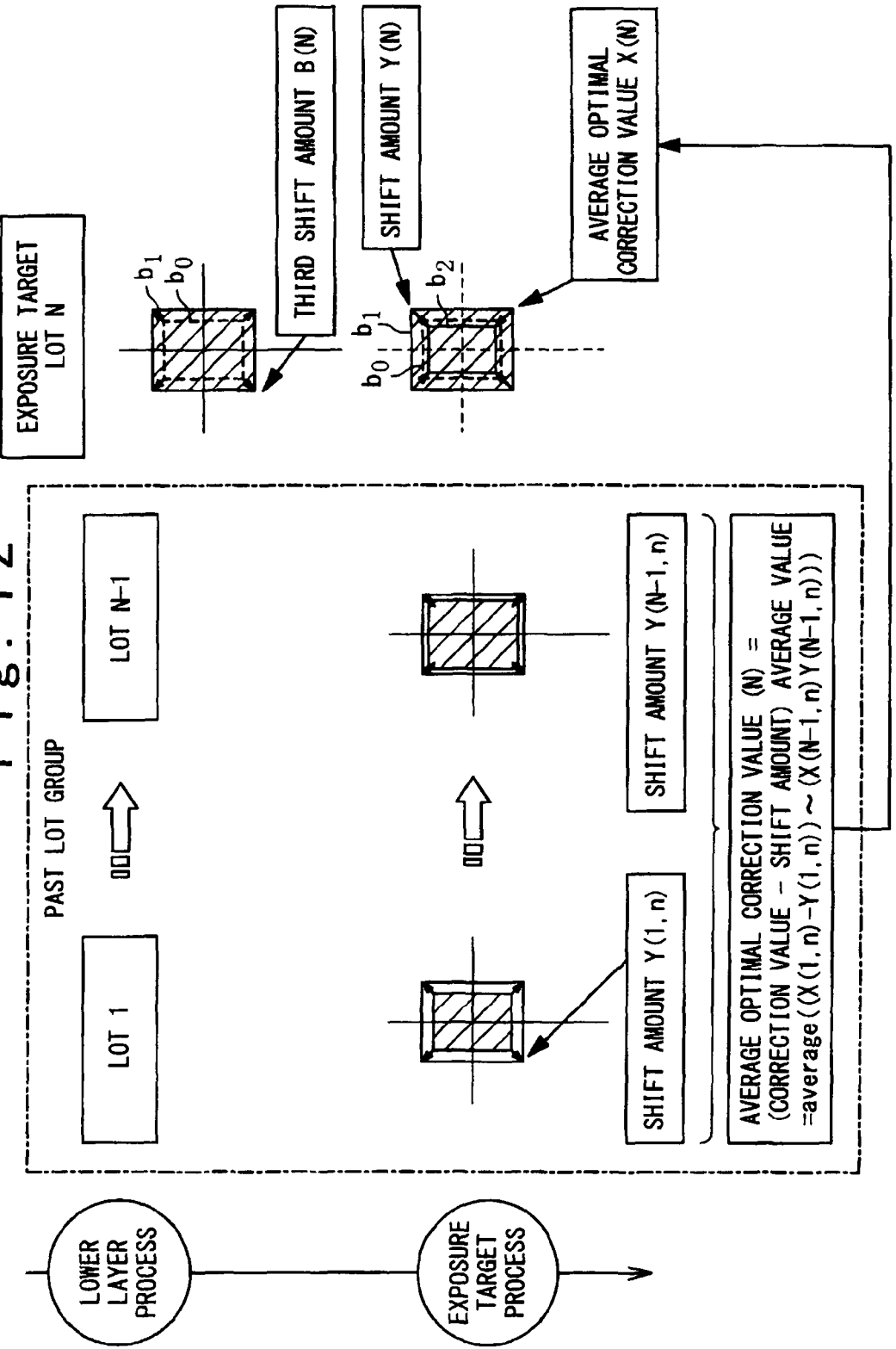
Figure 13:
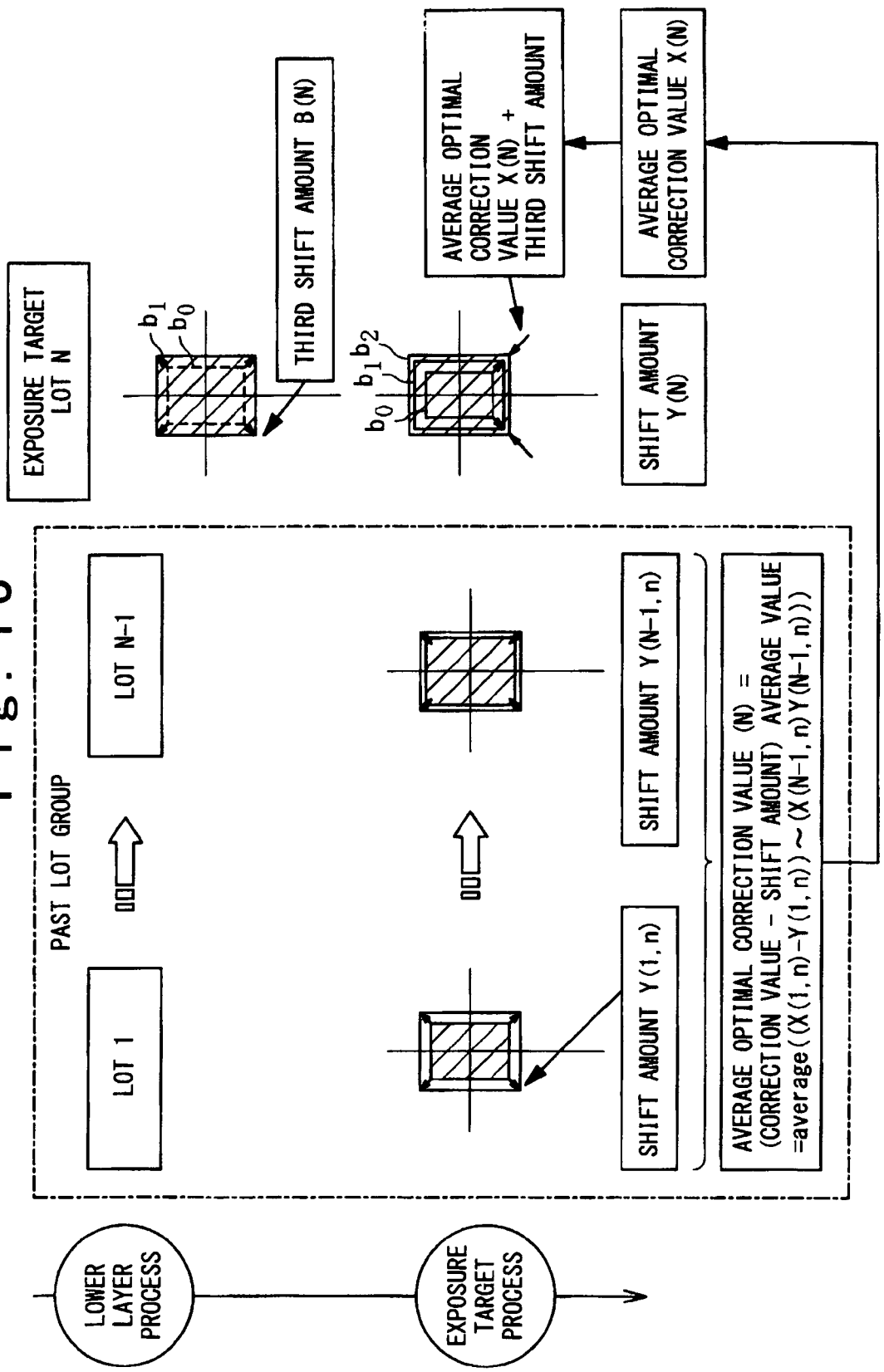

FIGS. 12 and 13 are diagrams showing the shot reduction. FIG. 12 is for comparison with the present embodiment, and shows a state when the third shift amount is not reflected at the time of exposure of an exposure target pattern (b2) in the exposure target lot N. FIG. 12 shows a spatial relationship among a lower layer pattern (b0) in the past lot group, a lower layer pattern (b1) in the exposure target lot N, and the exposure target pattern (b2) of the exposure target lot N. A position of the exposure target pattern (b2) is determined based on the averaged optimum correction value of the exposure target patterns in the past lot group. The averaged optimum correction value X is a value calculated based on a shift of the exposure target pattern of the past lot group from the lower layer pattern (b0) in the past lot group. Ideally, the pattern (b2) is made to be coincident with the pattern (b0) by using the averaged optimum correction value X (practically, a shift arises also between the pattern (b2) and the pattern (b0)). However, even if the shift between the pattern (b2) and the pattern (b0) is zero, a shift will arise also between the pattern (b2) and the pattern (b1) when a shift (the third shift amount) has arisen between the pattern (b1) and the pattern (b0). That is, if the lower layer pattern (b1) has shifted from the past lot group, a shift (pattern shift) will arise between the exposure target pattern (b2) and the lower layer pattern (a1).

FIG. 13 is a diagram showing the shot reduction in the present embodiment. FIG. 13 shows a relative spatial relationship among the exposure target pattern (b2) in the exposure target lot N, the lower layer pattern (b1) corresponding to the exposure target pattern, and the lower layer pattern (b0) in the past lot group. According to the present embodiment, in addition to an average of the optimum correction values in the past lot group, the third shift amount is reflected to the exposure position of the exposure target pattern (b2). By reflecting the third shift amount, the shift of the lower layer pattern (b1) from the past lot group is cancelled.

When FIGS. 12 and 13 are compared with each other, it could be understood that in the present embodiment, the variation amount of the lower layer pattern (b1) from the past lot group (the third shift amount) is reflected to the exposure position of the exposure target pattern (b2), so that the exposure position is adjusted with excellent accuracy. In addition, in spite of reflecting the third shift amount, a shift may arise practically between the exposure target pattern (b2) and the lower layer pattern (b1). This shift is measured as the pattern shift amount Y, which will be used when the upper layer pattern is formed by using this exposure target pattern as the lower layer.

Figure 14:
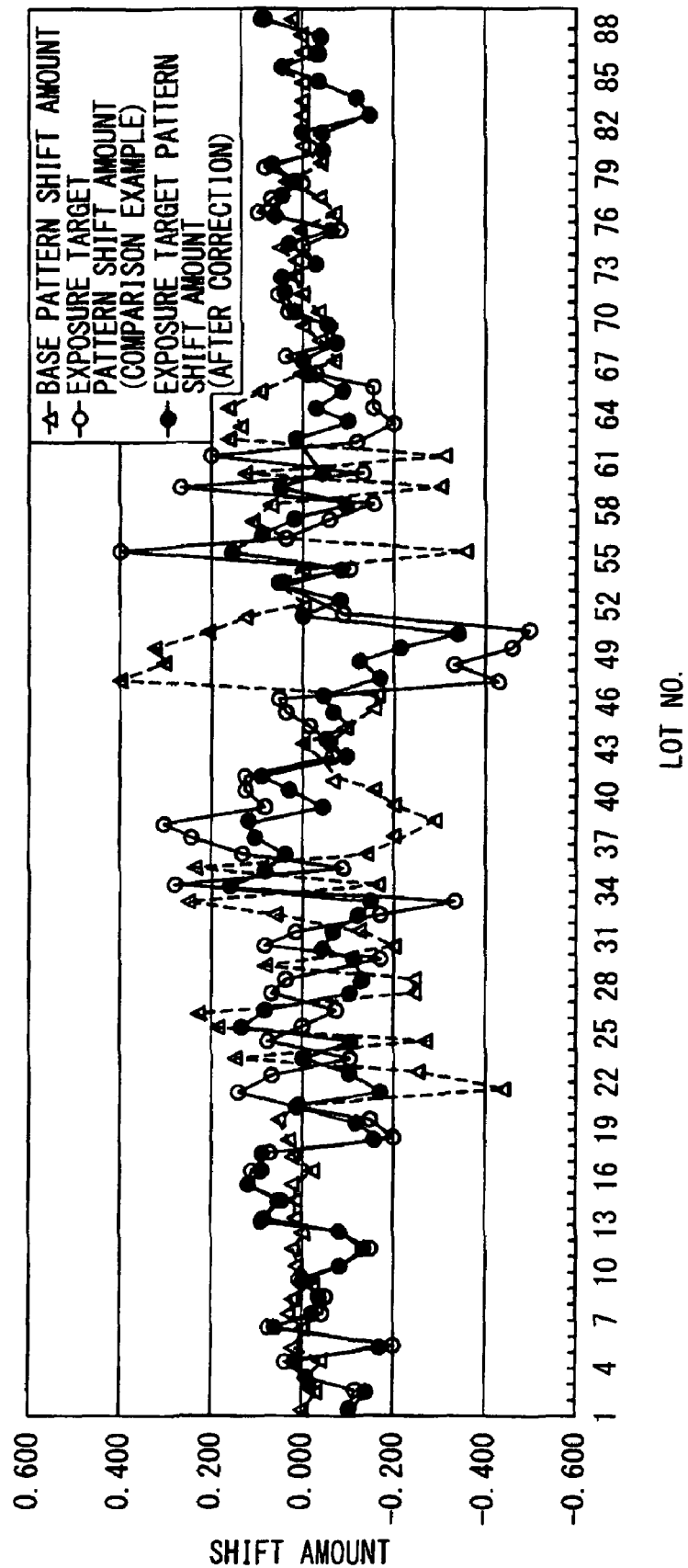
FIG. 14 is a trend graph for explaining the operation of the embodiment.

FIG. 14 shows a trend graph showing the effect of the present embodiment. In FIG. 14, white triangles show the pattern shift amounts in the lower layer pattern of the exposure target lot N. That is, each indicates a value of the third shift amount. The white circles show the pattern shift amounts of the exposure target pattern when the third shift amount is not reflected, and is shown for comparison. The black circles show the pattern shift amounts of the exposure target pattern when the third shift amount is reflected. As can be seen from FIG. 14, by reflecting the third shift amount to the exposure position of the exposure target pattern, an absolute value of the pattern shift amount of the exposure target pattern becomes small.

As explained above, according to the present embodiment, the variation (shift) amount of the position of the lower layer pattern from that of the past lot group is reflected to the exposure position of the exposure target pattern. This process allows the exposure position to be adjusted accurately. As a result, the number of times of reworking due to a shift of the exposure position can be reduced, and productivity can be improved. Cost can also be reduced through reduction in a useless process due to the reworking.

Moreover, according to the present embodiment, the shift amount calculating section 14 calculates the pattern shift amount of the pattern formed in a process in which no lower layer pattern exists (for example, the first layer process). For example, in an alignment correction method described in Japanese Patent Application Publication (JP-A-Heisei 11-102851), a self-rotation amount in the first process is set to zero. Therefore, the pattern shift amount of the pattern formed in the first layer process is not reflected to the correction value of the exposure position of the exposure target pattern. On the other hand, in the present embodiment, the pattern shift amount of the pattern formed in the first layer process is also fed back to the position of the exposure target pattern, and therefore the exposure position can be adjusted more accurately.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. An exposure aligning method, the method comprising:
    determining a first shift amount indicating a shift amount of a lower layer pattern of an exposure target substrate from an origin point position;
    determining a second shift amount indicating a shift amount of the lower layer pattern in at least one past lot which has been processed before said exposure target substrate is processed, from the origin point position;
    calculating a third shift amount indicating a difference between the first shift amount and the second shift amount;
    determining a first correction value based on the third shift amount; and
    adjusting an exposure position of an exposure target pattern based on the first correction value.

2. The exposure aligning method according to claim 1, wherein a plurality of patterns including the lower layer pattern are formed on said exposure target substrate,
    wherein said exposure aligning method further comprises determining a fourth shift amount indicating a shift amount of each of patterns of the plurality of layers based on the lower layer pattern corresponding to each pattern, and
    wherein said determining the first shift amount comprises determining the first shift amount by summing the fourth shift amounts of the patterns of the plurality of layers.

3. The exposure aligning method according to claim 2, further comprising a plurality of past lots, and
    wherein said determining a second shift amount comprises:
        determining as a sixth shift amount, said sixth shift amount comprising a shift amount of the lower layer pattern from the origin point position in each of the plurality of past lots; and
        calculating an average of the sixth shift amounts of the plurality of past lots as the second shift amount.

4. The exposure aligning method according to claim 2, wherein said determining the fourth shift amount comprises calculating, when the lower layer pattern corresponding to an nth layer pattern does not exist, determining the fourth shift amount for the nth layer based on a difference between a correction value of the exposure position applied when an (n+α)th layer pattern having the nth layer pattern as the lower layer pattern is exposed, and a value indicating a position of the (n+α)th layer pattern formed actually.

5. The exposure aligning method according to claim 1, further comprising determining an optimum correction value based on a difference between the correction value of the exposure position applied when the exposure target pattern is exposed in said at least one past lot and a shift amount of the exposure target pattern formed actually in said at least one past lot from the lower layer pattern, such that the shift mount the exposure target pattern from the lower layer pattern is zero,
    wherein said determining the first correction value comprises calculating the first correction value based on the optimal correction value.

6. A tangible computer-readable recording medium in which a computer-readable program code is recorded to realize an exposure aligning method, said method comprising:
    determining a first shift amount indicating a shift amount of a lower layer pattern of an exposure target substrate from an origin point position;
    determining a second shift amount indicating a shift amount of the lower layer pattern in at least one past lot which has been processed before said exposure target substrate is processed, from the origin point position;
    calculating a third shift amount indicating a difference between the first shift amount and the second shift amount;
    determining a first correction value based on the third shift amount; and adjusting an exposure position of an exposure target pattern based on the first correction value.

7. The computer-readable recording medium according to claim 6, wherein a plurality of patterns including the lower layer pattern are formed on said exposure target substrate,
wherein said exposure aligning method further comprises determining a fourth shift amount indicating a shift amount of each of patterns of the plurality of layers based on the lower layer pattern corresponding to each pattern, and
wherein said determining the first shift amount comprises determining the first shift amount by summing the fourth shift amounts of the patterns of the plurality of layers.

8. The computer-readable recording medium according to claim 7, further comprising a plurality of past lots, and
wherein said determining a second shift amount comprises:
determining as a sixth shift amount, said sixth shift amount comprising a shift amount of the lower layer pattern from the origin point position in each of the plurality of past lots; and
calculating an average of the sixth shift amounts of the plurality of past lots as the second shift amount.

9. The computer-readable recording medium according to claim 7, wherein said determining the fourth shift amount comprises calculating, when the lower layer pattern corresponding to an nth layer pattern does not exist, determining the fourth shift amount for the nth layer based on a difference between a correction value of the exposure position applied when an (n+α)th layer pattern having the nth layer pattern as the lower layer pattern is exposed, and a value indicating a position of the (n+α)th layer pattern formed actually.

10. The computer-readable recording medium according to claim 6, wherein said exposure aligning method further comprises determining an optimum correction value based on a difference between the correction value of the exposure position applied when the exposure target pattern is exposed in said at least one past lot and a shift amount of the exposure target pattern formed actually in said at least one past lot from the lower layer pattern, such that the shift mount the exposure target pattern from the lower layer pattern is zero,
wherein said determining a first correction value comprises calculating the first correction value based on the optimal correction value.

11. A tangible computer-readable recording medium in which a computer-readable program code is recorded to perform an exposure aligning method, said method comprising:
calculating a first shift amount by calculating a shift amount of a tower layer pattern from a predetermined origin position in a present exposure target lot;
calculating an average optimal correction value of past lot groups corresponding to shift amounts of lower layer patterns from their respective origin positions of said past lot groups as a second shift amount;
calculating a third shift amount based on a difference between the first shift amount and the second shift amount; and
adjusting the lower layer pattern in the present exposure target lot by the third shift amount.

12. The computer-readable recording medium according to claim 11, further comprising measuring a pattern shift amount of a formed pattern by using a pattern formed in a first process as a lower layer,
wherein the first shift amount sums the measured pattern shift amounts from the first layer to the target layer.

13. The computer-readable recording medium according to claim 12, wherein, if there is no measured shift amount for the first process, calculating the first shift amount based on process histories comprising measurement results of a past pattern shift amount.

14. The computer-readable recording medium according to claim 13, wherein, if there are no process histories comprising measurement results of the past pattern shift amount, calculating a correction value based on said past lot groups based on a past correction value applied at a time of exposure of an exposure target pattern and a pattern shift amount of a resulting formed exposure target pattern.

* * * * *